(12) United States Patent
Klocke et al.

(10) Patent No.: US 10,072,944 B2
(45) Date of Patent: Sep. 11, 2018

(54) DEVICE FOR MEASUREMENT OF AN ANGLE OF AN AXIS OF ROTATION

(71) Applicant: TDK-Micronas GmbH, Freiburg (DE)

(72) Inventors: Tobias Klocke, Lippstadt (DE); Yan Bondar, Waldkirch (DE)

(73) Assignee: TDK-Micronas GmbH, Freiburg (DE)

( * ) Notice: Subject to any disclaimer, the term of this patent is extended or adjusted under 35 U.S.C. 154(b) by 97 days.

(21) Appl. No.: 14/582,016

(22) Filed: Dec. 23, 2014

(65) Prior Publication Data

US 2015/0177023 A1 Jun. 25, 2015

(30) Foreign Application Priority Data

Dec. 23, 2013 (DE) .................. 10 2013 114 825

(51) Int. Cl.
- *G01B 7/30* (2006.01)
- *G01D 5/12* (2006.01)
- *G01R 33/00* (2006.01)
- *G01D 5/14* (2006.01)

(52) U.S. Cl.
CPC ............... *G01D 5/12* (2013.01); *G01B 7/30* (2013.01); *G01D 5/145* (2013.01); *G01R 33/0011* (2013.01)

(58) Field of Classification Search
CPC . G01B 7/30; G01B 7/305; G01B 7/31; G01B 7/315; G01D 5/12; G01D 5/145; G01D 5/142; G01R 33/0011; G01R 33/09; G01R 33/07; G01R 33/077; B62D 15/02; B62D 15/021; B62D 15/0215; B62D 15/022; G01P 3/465; G01P 3/487

USPC .................. 324/207.11–207.19, 207.2, 324/207.21–207.26, 232; 310/43, 154.11, 310/154.13, 154.17, 154.18, 154.25, 310/154.46, 154.47, 156.06, 156.07
See application file for complete search history.

(56) References Cited

U.S. PATENT DOCUMENTS

| | | | | |
|---|---|---|---|---|
| 5,351,387 A | * | 10/1994 | Iwata | G01D 5/145 29/602.1 |
| 6,310,473 B1 | * | 10/2001 | Zhao | G01D 5/145 324/207.2 |
| 6,462,450 B1 | * | 10/2002 | Haussecker | G01B 7/30 310/156.09 |
| 2011/0215797 A1 | * | 9/2011 | Steinich | G01B 7/003 324/207.25 |
| 2012/0146627 A1 | * | 6/2012 | Masson | B62D 6/10 324/207.21 |
| 2013/0179117 A1 | * | 7/2013 | Delbaere | G01D 5/145 702/150 |

* cited by examiner

*Primary Examiner* — Jermele M Hollington
*Assistant Examiner* — Steven Yeninas
(74) *Attorney, Agent, or Firm* — Intellectual Property Law Group LLP

(57) ABSTRACT

The invention relates to a device (1) for measurement of an angle of an axis of rotation (10), comprising a magnet (12) with a magnet surface (14), which is pivotally assembled at the axis of rotation (10), and further comprising a sensor (16) for recognition of external magnetic flux lines of the magnet (12). According to the invention, the magnet (12) comprises at least a first magnet section (20) with a magnetic first orientation (22) and the magnet (12) further at least comprises a second magnet section (24) with a second magnetic orientation (26), wherein the first magnetic orientation (22) is displaced from the second magnetic orientation (26), whereby the magnet surface (14) comprises a different concentration of external magnetic flux lines.

12 Claims, 2 Drawing Sheets

DEVICE FOR MEASUREMENT OF AN ANGLE OF AN AXIS OF ROTATION

CROSS-REFERENCE TO RELATED APPLICATION

This application claims foreign priority under 35 U.S.C. § 119 to German Patent Application no. 10 2013 114 825.5, filed on Dec. 23, 2013, the entire contents of which is hereby incorporated by reference.

BACKGROUND OF THE INVENTION

1. Field of the Invention

The invention relates to a device for measurement of an angle of an axis of rotation comprising a magnet with a magnet surface, which is pivotally mounted at the axis of rotation. More particularly, the device further comprises a sensor for recognition of external magnetic flux lines of the magnet.

2. Background

It is known that the measurement of an angle of an axis of rotation occurs by a magnetic sensor, whereby through the magnetic sensor a magnetic field of a magnet can be determined. A magnetic ring neck can be used as a magnet, wherein the sensor is positioned in the center underneath the magnetic ring neck. The magnetic ring neck is formed by two terminal pairs. It has turned out as a disadvantage that the magnetic field is formed in the shortest way between the two terminal pairs though. Since the sensor is positioned in the center underneath the magnetic ring neck the desired concentration of the magnetic field does not occur in this area. This leads to the fact that the false position of the magnet towards the sensor involves a highly increased sensor error.

SUMMARY OF THE INVENTION

Therefore, it is the objection of the present invention to provide a device for measuring the angle of an axis of rotation, wherein the device is simple and reliably built. Particularly, it is the objection of the present invention that the measurement of an angle of an axis of rotation is almost independent from a possible false position of the magnet towards the sensor.

For the solution of this objection a device for measurement of an angle of an axis of rotation with the features of claim 1 is intended, particularly with the features of the characterizing part. In the dependent claims preferable embodiments are described. Thereby the features mentioned in the claims and in the description can be essential according to the invention in detail or in combination.

The invention discloses a device for measurement of an angle of an axis of rotation, comprising a magnet with a magnet surface, wherein the magnet is pivotally assembled at the axis of rotation. Further, the device comprises a sensor for the recognition of external magnetic flux lines of the magnet. According to the invention it is intended that the magnet comprises at least a first magnet section with a first magnetic orientation. Further, the magnet comprises at least a second magnet section with a second magnetic orientation. Thereby, the first magnetic orientation is displaced towards the second magnetic orientation, whereby the magnetic surface comprises a different concentration of external magnetic flux lines. By the usage of magnet sections, wherein each magnet section comprises a north pole and a south pole, an overlap of magnetic flux lines can a occur. So the first and the second magnet section is assembled in a way that across the surface of the magnet formed by the first and the second magnet section, a different concentration of external magnetic flux lines is performed. So the magnetic flux lines can compensate each other in an area of the magnet surface in a way that at this position hardly any magnetic flux lines are detectable by the sensor. In return the external magnetic flux lines can be potentiated in a way that in an area of the magnetic surface and increased concentration of external magnetic flux lines can be observed. A magnetic sensor, which is at this position guidable across the magnetic surface, can detect the different concentrations of extent of flux lines accordingly. Thereby, a steady alteration of the concentration of magnetic flux lines it is granted directly across the surface. This applies also for the extension of magnetic flux lines in the near range above the surface of the magnet. Accordingly, an alteration of the magnet relative towards the sensor is definitely measurement-wise detectable via the sensor. Thereby, a Hall-/AMR-/GMR-sensor can be used as the sensor.

According to the invention it is possible that the first magnetic orientation is displaced towards the second orientation in an angle of 90°. By the displacement of the first magnetic orientation towards the second magnetic orientation in an angle of 90° an external magnetic field can be created at the magnetic surface wherein the external magnetic field extends periodically between a concentration of magnetic flux lines and a reduction of magnetic flux lines alongside the magnetic surface. Thereby, multiple first and second magnet sections can be applied wherein the magnet sections can be tilted each about 90° in the direction of the longitudinal axis of the magnet.

According to the invention it can be intended for the device that the magnet is assembled outside the axis of rotation at the circular arc of the axis of rotation. By the assembly of the magnet outside the axis of rotation on circular arc the circular arc can be shaped in the way that it is guided on a radius of the axis of rotation. Thereby, the magnet surface can be guided on a circular arc outside the axis of rotation. Thereby, the sensor can also be assembled outside the axis of rotation, wherein the sensor can be assembled at a spot of the circular arc at the magnetic surface. During the rotation of the axis of rotation the magnet surface is guided accordingly alongside the circular arc at the sensor. By magnetization of the magnet thereby the flux lines are guided on radiance and thereby appear to the sensor like with a linear displacement for example of the magnetic block. Thereby, the sensor performance can be increased since the false position is not that intensely tempering the sensor signal of the sensor.

Further, it is an advantage that the magnet is formed in one piece. The term one piece is to be understood between the term poles of a purely sufficient solid connection and the one piece. A formation of the magnet in one piece provides the advantage that the first magnet section and second magnet section are formed connectedly. By the one piece form it is given that for example only a portion of the magnet can be connected with the axis of rotation in order to move the complete magnet on a circular arc of the axis of rotation.

In a preferred embodiment it is intended that the first magnet sector and the second magnet sector is a permanent magnet. The usage of a permanent magnet comprises the advantage regarding an electromagnet that this does not have to be powered. An energetic supply of the first magnet section or the second magnet section can thereby remain undone. The development of the first magnet section and the second magnet section to a magnet can thereby occur in one production step, whereby the production costs can be reduced.

According to the invention it is possible that the magnet is assembled at a first part of the steady body and a second part of the steady body is pivotally assembled at the axis of rotation. The steady body can thereby be shaped in a way that the steady body can receive the first and the second magnet section. The steady body can thereby comprise the wedge-like recess, wherein the first and/or the second magnet section can also be shaped wedge-like whereby the wedge-like first magnet section and/or second magnet section can be inserted in the wedge-like recess of the steady body. Thereby, a sufficiently necessary assembly of the first and/or the second magnet section at the steady body can occur. It is also possible that the first and/or the second magnet section can be assembled with the steady body in a glue process. By the shape of the recess of the steady body in a way that the first and/or the second magnet section are assembled at the steady body the first and/or the second magnet section can be assembled at the steady body as separate corporal-spatial objects. Thereby, separated first and second magnet sections can be assembled at the steady body, whereby the sufficiently solid connection of the first magnet section is required.

Further, it is an advantage that the steady body is made of plastic. The performance from plastic enables that the magnetic flux lines can penetrate the plastic and thereby reach the sensor almost unhindered. Moreover, the development of the steady body from plastic is cost efficient. Thereby, it is possible that the plastic comprises ferromagnetic areas whereby a shielding of the magnetic flux lines can be reached.

Moreover it is intended according to the invention that the steady body comprises an opening, whereby the axis of rotation is inserted into the opening. The opening can be dimensioned in a way that it is slightly smaller as the axis of rotation viewed in the cross-section. Thereby the axis of rotation can be squeezed into the opening, particularly if the steady body is made from plastic. Also the metallic formation of the steady body is possible whereby the axis of rotation can also be assembled at the steady body through the opening in a forcefitting and formfitting way via a compression method. For a simple mounting of the axis of rotation at the steady body through the opening a glue method or a welding method can be performed. The glue method is preferred when the steady body and/or the axis of rotation are made from plastic. A welding method is preferred, when the steady body and the axis of rotation are made from metal.

It is possible according to the invention that the axis of rotation is forcefittingly assembled at the first part of the steady body via a crimp connection. The crimp connection has the advantage that no further components for the assembly of the axis of rotation have to be applied at the second part of the steady body. Thereby, an application of screwed connections and/or glue connections for the assembly of the axis of rotation at the second part of the steady body can be resigned.

It is further an advantage that the steady body comprises a recess and the magnet is at least partially assembled in the recess. The recess can thereby be in a wedge-like form. The magnet with its first and second magnet section can be in a complementary wedge-like form thereto. By the wedge-like formation of the magnet, the magnet can be assembled at the recess without additional attachment means. Likewise the magnet can be formed wedge-like in a way that during the insertion the wedge-like magnet a flush surface with the steady body occurs.

BRIEF DESCRIPTION OF THE DRAWINGS

Further procedures and advantages of the invention reside from the claims of the subsequence description and the drawings. Thereby, the features described in the claims and in the description can individually or in any combination be essential for the invention. It is shown:

DETAILED DESCRIPTION OF SPECIFIC EMBODIMENTS

Figure 1:
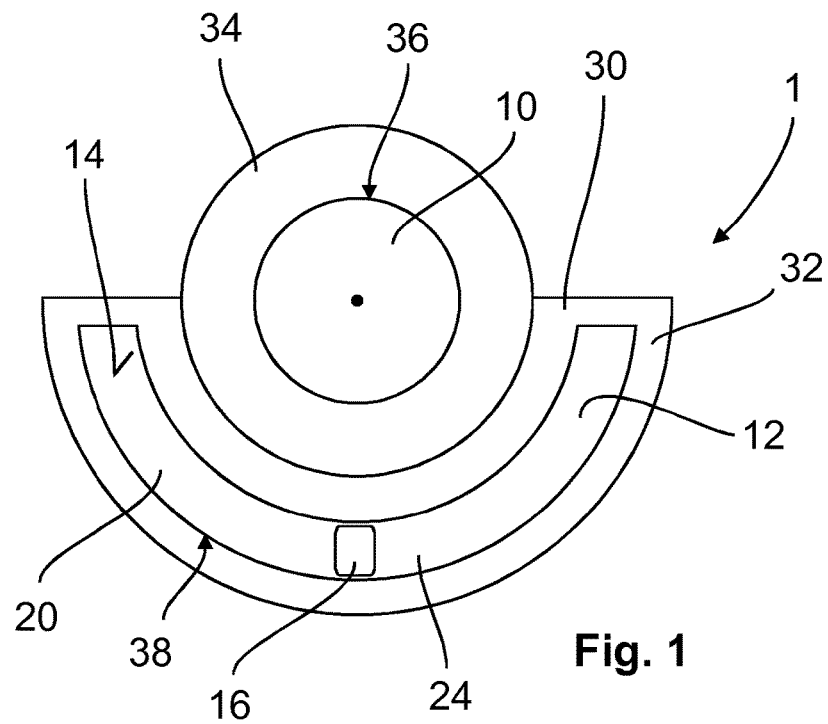
FIG. 1 a schematic view of a device according to the invention for measurement of an angle of an axis of rotation, FIG. 2 a schematic view of a magnet 12, wherein the magnet 12 comprises multiple magnet sections and FIG. 3 a schematic view of a device for measurement of an angle of an axis of rotation in a side view.

In FIG. 1 a schematic view of a device 1 for measurement of an angle of an axis of rotation 10 is shown. At the axis of rotation 10 a steady body 30 is assembled. The steady body 30 comprises an opening 36, wherein the axis of rotation 10 is inserted in the opening 36. The cross-section of the axis of rotation 10 can thereby be minimal greater as the opening 36, wherein during the insertion of the axis of rotation 10 into the opening 36 the steady body 30 can be forcefittingly connected with the axis of rotation 10 by a crimp connection. It is further possible that the cross-section of the axis of rotation 10 is equal to the cross-section of the opening 36, wherein an insertion of the axis of rotation 10 into the opening 36 can be enabled without effort. In this case the axis of rotation 10 can be assembled at the opening 36 of the steady body 30 via glue or welding process. The steady body 30 thereby comprises a ring element 31 and a semi-circular ring segment 32. The ring element 34 and the semi-circular ring segment 32 can thereby be formed in one piece. The ring element 34 thereby comprises the opening 36. The semi-circular ring segment 32 comprises a recess 38 wherein the magnet 12 is assembled in the recess 38. The magnet 12 thereby comprises a first magnet section 20 and a second magnet section 24. The magnet 12 comprises a magnet surface 14, wherein the magnet surface 14 can be evenly shaped. The sensor 16 can be assembled above the magnet surface 14, wherein the strength of the magnetic field based on the magnet 12 can be recorded via the sensor 16 by measurement techniques.

Figure 2:
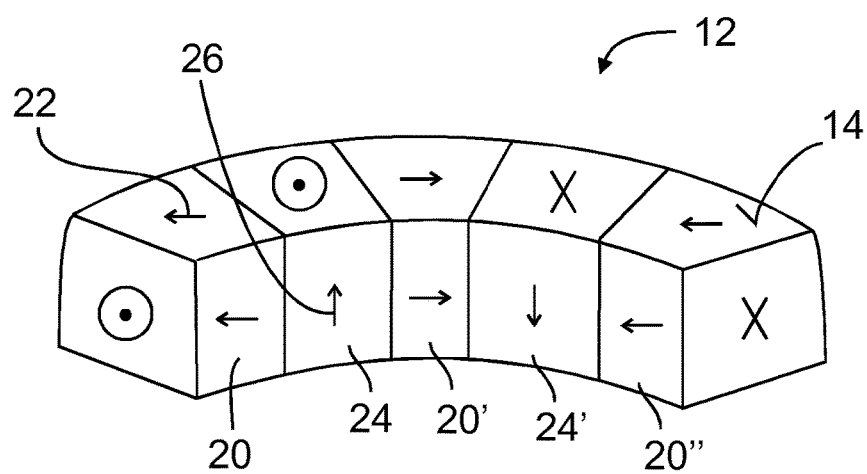

In FIG. 2 a magnet 12 is schematically shown. The magnet 12 thereby comprises a first magnet section 20 and a second magnet section 24. At the second magnet section 24 a further first magnet section 20' and at the magnet section 20' a further second magnet section 24' is assembled. Wherein at the further second magnet section 24' a further first magnet section 20' is assembled. A magnetic orientation 22 of the first magnet section 20 is thereby aligned about 90° to a further second magnetic orientation 26 of the second magnet section 24. The magnetic orientation of the further second magnet section 20' is thereby also aligned about 90° towards the second magnetic orientation 26. Accordingly, the magnetic orientation alternates from magnet section to magnet section each about 90°. Thereby, a different concentration alongside the surface 14 of the magnet 12 of magnetic flux lines can be achieved at the surface 14 of the magnet 12. In connection with a sensor the sensor can register and measurement-technically analyze the different concentrations of magnetic flux lines during the passage of the surface 14 at the sensor, wherein the relative position of the magnet 12 towards the sensor can be registered. The magnet 12 is thereby shaped as the ring segment. The magnet 12 can also be formed wedge-like, wherein the wedge-like formed magnet 12 is assembled in a recess of a steady body.

Figure 3:
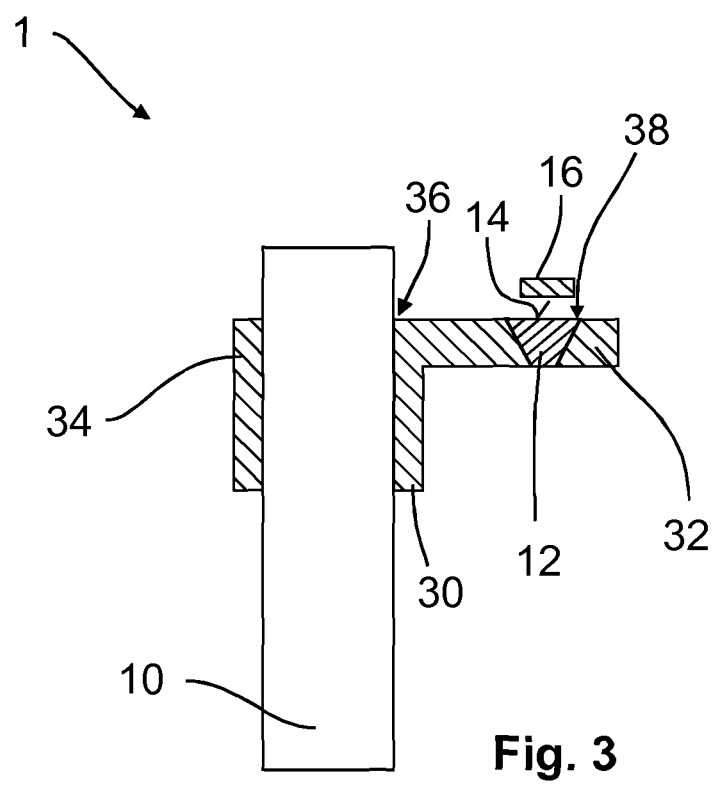

In FIG. 3 a schematic lateral view of a device for measurement of an angle of an axis of rotation 10 is shown. At the axis of rotation 10 a second part in the form of the ring element 34 of a steady body 30 is assembled. The second part of the steady body 30 thereby comprises an opening 36, wherein the axis of rotation 10 projects through the opening 36. The opening 36 can thereby be smaller regarding the cross-section as the cross-section of the axis of rotation 10, so that by insertion of the axis of rotation 10 into the opening 36 the steady body 30 can be connected with the axis of rotation 10 via a crimp connection. Thereby, the axis of rotation 10 is form- and forcefittingly connected to the second part of the steady body 30. The steady body 30 comprises a first part in the form of the semi-circular ring segment 32, wherein the first part of the steady body 30 comprises a recess 38. In the recess 38 a magnet 12 is assembled. The magnet 12 is thereby formed wedge-like, wherein the recess 38 is shaped complementary to the wedge-like formation of the magnet 12. A magnet surface 14 of the magnet 12 is there by assembled flash at the first part of this steady body 30. The magnetic field of the magnet 12 is thereby registerable by a sensor 16. The sensor 16 can thereby be assembled with a processor unit for the analysis of the received magnetic field via a wire-connected or wireless connection.

What is claimed is:

1. A device (1) for measurement of an angle of an axis of rotation (10) comprising a magnet (12) with a magnet surface (14), which is pivotally mounted at the axis of rotation (10), further comprising a sensor (16) for recognition of external magnetic flux lines of the magnet (12), characterized in that,
    the magnet (12) comprises at least one first magnet section (20) with a first magnetic orientation (22) and the magnet (12) further comprises at least one second magnet section (24) with a second magnetic orientation (26),
    wherein the magnet (12) is assembled at a circular arc outside of the axis of rotation (10),
    wherein within the circular arc the first magnetic orientation (22) is displaced from the second magnetic orientation (26) in an axial direction and in an azimuthal direction in an angle of 90° respectively,
    whereby the magnet surface (14) comprises a diverse concentration of external magnetic flux lines;
    wherein a steady body is provided, having:
        a first part in a form of a semicircular ring, and
        a second part in a form of a cylindrical ring, pivotally assembled at the axis of rotation;
    wherein the magnet is assembled at the first part,
    wherein the steady body (30) is formed in plastic.

2. The device (1) according to claim 1, characterized in that the magnet (12) is composed of one piece.

3. The device (1) according to claim 1, characterized in that the first magnet section (20) and the second magnet section (24) is a permanent magnet.

4. The device (1) according to claim 1, characterized in that the steady body (30) comprises an opening (36), wherein the axis of rotation (10) is inserted in the opening (36).

5. The device (1) according to claim 1, wherein the axis of rotation (10) is force fittingly assembled at the second part (32) of the steady body (30) by a press fit.

6. The device (1) according to claim 1, characterized in that the steady body (30) comprises an acceptance (38) and the magnet (12) is at least partially assembled in the acceptance (38).

7. A device (1) for measurement of an angle of an axis of rotation (10) comprising a magnet (12) with a magnet surface (14), which is pivotally mounted at the axis of rotation (10), further comprising a sensor (16) for recognition of external magnetic flux lines of the magnet (12), characterized in that,
    the magnet (12) comprises at least one first magnet section (20) with a first magnetic orientation (22) and the magnet (12) further comprises at least one second magnet section (24) with a second magnetic orientation (26),
    wherein the magnet (12) is assembled at a circular arc outside of the axis of rotation (10),
    wherein within the circular arc the first magnetic orientation (22) is displaced from the second magnetic orientation (26) in an axial direction and in an azimuthal direction in an angle of 90° respectively,
    whereby the magnet surface (14) comprises a diverse concentration of external magnetic flux lines;
    wherein a steady body is provided, having:
        a first part in a form of a semicircular ring, and
        a second part in a form of a cylindrical ring, pivotally assembled at the axis of rotation;
    wherein the magnet is assembled at the first part,
    wherein the steady body (30) comprises an acceptance (38) and the magnet (12) is at least partially assembled in the acceptance (38), and
    wherein the acceptance is in a wedge-like form.

8. The device (1) according to claim 7, characterized in that the magnet (12) is composed of one piece.

9. The device (1) according to claim 7, characterized in that the first magnet section (20) and the second magnet section (24) is a permanent magnet.

10. The device (1) according to claim 7, characterized in that the steady body (30) is formed in plastic.

11. The device (1) according to claim 7, characterized in that the steady body (30) comprises an opening (36), wherein the axis of rotation (10) is inserted in the opening (36).

12. The device (1) according to claim 7, wherein the axis of rotation (10) is force fittingly assembled at the second part (32) of the steady body (30) by a press fit.

* * * * *